United States Patent
Kim et al.

(10) Patent No.: US 9,293,335 B2
(45) Date of Patent: Mar. 22, 2016

(54) METHOD OF FABRICATING SEMICONDUCTOR DEVICE

(71) Applicants: JinGyun Kim, Yongin-si (KR); Myoungbum Lee, Seoul (KR); Seungmok Shin, Yongin-si (KR)

(72) Inventors: JinGyun Kim, Yongin-si (KR); Myoungbum Lee, Seoul (KR); Seungmok Shin, Yongin-si (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 141 days.

(21) Appl. No.: 13/912,441

(22) Filed: Jun. 7, 2013

(65) Prior Publication Data

US 2013/0273728 A1   Oct. 17, 2013

Related U.S. Application Data

(63) Continuation of application No. 12/654,881, filed on Jan. 7, 2010, now Pat. No. 8,460,998.

(30) Foreign Application Priority Data

Jan. 9, 2009   (KR) .................. 10-2009-0001979

(51) Int. Cl.
| | | |
|---|---|---|
| *H01L 21/28* | (2006.01) | |
| *H01L 27/115* | (2006.01) | |
| *H01L 29/66* | (2006.01) | |
| *H01L 29/788* | (2006.01) | |
| *H01L 29/792* | (2006.01) | |

(52) U.S. Cl.
CPC .... *H01L 21/28282* (2013.01); *H01L 27/11521* (2013.01); *H01L 27/11556* (2013.01); *H01L 27/11568* (2013.01); *H01L 29/66825* (2013.01); *H01L 29/66833* (2013.01); *H01L 29/7881* (2013.01); *H01L 29/792* (2013.01); *H01L 29/7926* (2013.01)

(58) Field of Classification Search
None
See application file for complete search history.

(56) References Cited

U.S. PATENT DOCUMENTS

| | | |
|---|---|---|
| 5,126,290 A | 6/1992 | Lowrey et al. |
| 5,286,994 A | 2/1994 | Ozawa et al. |
| 5,397,748 A * | 3/1995 | Watanabe et al. ............. 438/762 |
| 5,619,063 A | 4/1997 | Chen et al. |
| 5,851,878 A | 12/1998 | Huang |
| 6,518,200 B2 | 2/2003 | Lin |
| 6,613,658 B2 | 9/2003 | Koyama et al. |
| 6,969,886 B1 | 11/2005 | Park et al. |
| 7,256,447 B2 | 8/2007 | Park et al. |
| 7,361,554 B2 | 4/2008 | Park et al. |
| 7,732,891 B2 | 6/2010 | Tanaka et al. |
| 7,910,979 B2 | 3/2011 | Matsuoka et al. |
| 8,063,435 B2 | 11/2011 | Cho |
| 8,097,911 B2 | 1/2012 | Keller |
| 8,143,661 B2 | 3/2012 | Fang et al. |
| 8,460,998 B2 * | 6/2013 | Kim ................ H01L 27/11521 257/E21.679 |
| 2002/0185711 A1 | 12/2002 | Lin |

(Continued)

FOREIGN PATENT DOCUMENTS

| | | |
|---|---|---|
| JP | 10-093083 A | 4/1998 |
| JP | 2006-140486 A | 6/2006 |

(Continued)

*Primary Examiner* — Seahvosh Nikmanesh
(74) *Attorney, Agent, or Firm* — Lee & Morse, P.C.

(57) ABSTRACT

A method of fabricating a semiconductor device including forming a charge storage layer, and forming a first tunnel insulating layer covering the charge storage layer, the forming of the first tunnel insulating layer including heat treating the charge storage layer.

20 Claims, 12 Drawing Sheets

(56) References Cited

U.S. PATENT DOCUMENTS

| | | | |
|---|---|---|---|
| 2003/0017670 A1* | 1/2003 | Luoh et al. | 438/257 |
| 2004/0113196 A1 | 6/2004 | Rudeck et al. | |
| 2006/0261401 A1* | 11/2006 | Bhattacharyya | B82Y 10/00 257/316 |
| 2007/0012988 A1* | 1/2007 | Bhattacharyya | G11C 16/0483 257/314 |
| 2007/0252201 A1* | 11/2007 | Kito et al. | 257/331 |
| 2008/0173928 A1 | 7/2008 | Arai et al. | |
| 2008/0173930 A1 | 7/2008 | Watanabe et al. | |
| 2009/0179253 A1* | 7/2009 | Levy et al. | 257/324 |
| 2010/0283097 A1 | 11/2010 | Endoh et al. | |
| 2011/0092033 A1 | 4/2011 | Arai et al. | |
| 2011/0248332 A1* | 10/2011 | Levy et al. | 257/324 |

FOREIGN PATENT DOCUMENTS

| | | |
|---|---|---|
| JP | 2007-317874 A | 12/2007 |
| KR | 10-2006-0042729 A | 5/2006 |
| KR | 10-2008-0058251 A | 6/2008 |
| KR | 10-2008-0069919 A | 7/2008 |

* cited by examiner

METHOD OF FABRICATING SEMICONDUCTOR DEVICE

CROSS REFERENCE TO RELATED APPLICATION

This is a continuation application based on pending application Ser. No. 12/654,881, filed Jan. 7, 2010, the entire contents of which is hereby incorporated by reference.

BACKGROUND

1. Field

Embodiments relate to a method of fabricating a semiconductor device.

2. Description of the Related Art

Recently, the integration degree of semiconductor devices has increased in order to achieve high performance and low cost in response to user's needs. In memory semiconductor devices, since the integration degree may be a significant factor for determining costs, an increase in the integration degree is especially important. In traditional two-dimensional, i.e., planar memory semiconductor devices, because the integration degree is determined by an area occupied by a unit memory cell, the technique used for forming fine patterns may have a great influence on the integration degree. However, since hyper-fine patterns may require high-priced equipment, while the integration degree of two-dimensional memory semiconductor devices is increasing, the increases are very limited. As alternatives for overcoming these limitations, developments have been made regarding techniques for forming three-dimensionally memory cells.

SUMMARY

Embodiments are directed to a method of fabricating a semiconductor device, which represents advances over the related art.

It is a feature of an embodiment to provide a method of fabricating a semiconductor device including a tunnel insulating layer.

It is another feature of an embodiment to provide a method of fabricating a semiconductor device having a three-dimensional structure.

At least one of the above and other features and advantages may be realized by providing a method of fabricating a semiconductor device including forming a charge storage layer, and forming a first tunnel insulating layer covering the charge storage layer, the forming of the first tunnel insulating layer including heat treating the charge storage layer.

The charge storage layer may include at least one of a silicon nitride layer and a polysilicon layer.

The heat treating the charge storage layer may include one of an oxidation process or a nitriding process.

The oxidation process may include at least one of a radical oxidation and wet oxidation. The nitriding process may include at least one of a plasma nitration and thermal nitration.

The method may further include forming a first semiconductor layer covering the charge storage layer such that the first semiconductor layer includes amorphous silicon or crystalline silicon, the heat treating the charge storage layer being performed after the forming of the first semiconductor layer.

The method may further include forming a gate layer, and forming a blocking insulating layer covering the gate layer, the forming of the charge storage layer including covering the blocking insulating layer with the charge storage layer.

The method may further include forming an active layer covering the first tunnel insulating layer, forming a second tunnel insulating layer interposed between the first tunnel insulating layer and the active layer, and forming a third tunnel insulating layer interposed between the second tunnel insulating layer and the active layer.

The forming of the second tunnel insulating layer may include performing one of an oxidation process or a nitriding process on the first tunnel insulating layer.

The forming of the second tunnel insulating layer may include depositing a second semiconductor layer on the first tunnel insulating layer, and performing an oxidation process on the second semiconductor layer.

The forming of the second tunnel insulating layer may include depositing one of a silicon oxide layer, a silicon nitride layer, or a high-k dielectric layer.

The forming of the third tunnel insulating layer may include performing one of an oxidation process or a nitriding process on the second tunnel insulating layer.

The forming of the third tunnel insulating layer may include depositing a third semiconductor layer on the second tunnel insulating layer, and performing an oxidation process on the third semiconductor layer.

At least one of the above and other features and advantages may also be realized by providing a method of fabricating a semiconductor device including alternately forming conductive layers and insulating layers on a substrate, forming an opening penetrating the conductive layers and the insulating layers, such that at least a portion of the substrate is exposed, forming a blocking insulating layer at a sidewall of the opening, forming a charge storage layer covering the blocking insulating layer, forming a tunnel insulating layer covering the charge storage layer after forming the charge storage layer, the tunnel insulating layer being formed by a heat treatment, and forming an active portion after forming the tunnel insulating layer, the active portion filling the opening.

BRIEF DESCRIPTION OF THE DRAWINGS

The above and other features and advantages will become more apparent to those of ordinary skill in the art by describing in detail exemplary embodiments with reference to the attached drawings, in which.

DETAILED DESCRIPTION

Figure 1A:
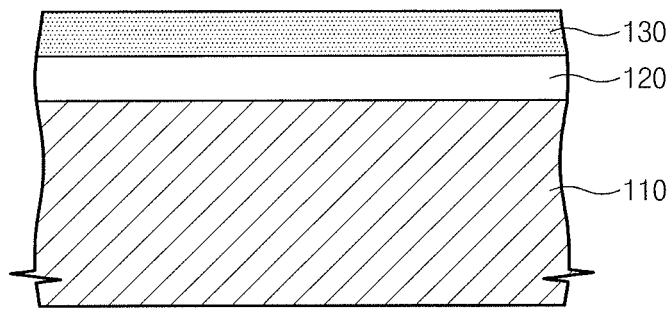
FIGS. 1A to 1C illustrate cross-sectional views of stages in a method of fabricating a semiconductor device according to an embodiment.

Korean Patent Application No. 10-2009-0001979, filed on Jan. 9, 2009, in the Korean Intellectual Property Office, and entitled: "Method of Fabricating Semiconductor Device," is incorporated by reference herein in its entirety.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. In addition, it will also be understood that when a layer is referred to as being "between" two layers, it can be the only layer between the two layers, or one or more intervening layers may also be present. Like reference numerals refer to like elements throughout.

It will be understood that, although the terms "first", "second", and so on may be used herein to describe each of the components, these components should not be limited by these terms. These terms are only used to distinguish one component from another component.

Hereinafter, a semiconductor device, e.g., a resistance variable memory device, and a method of forming the semiconductor device, e.g., the resistance variable memory device, according to an embodiment will be described in conjunction with the accompanying drawings.

Figure 1B:
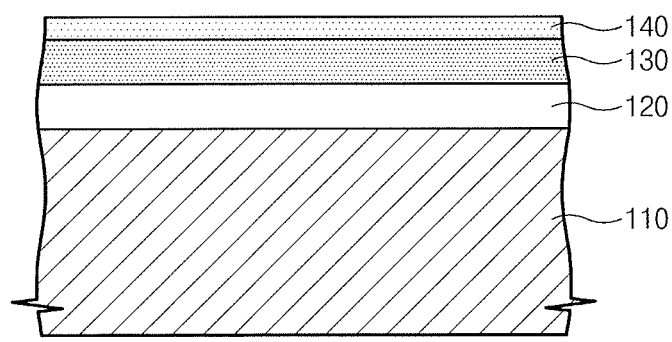
Figure 1C:
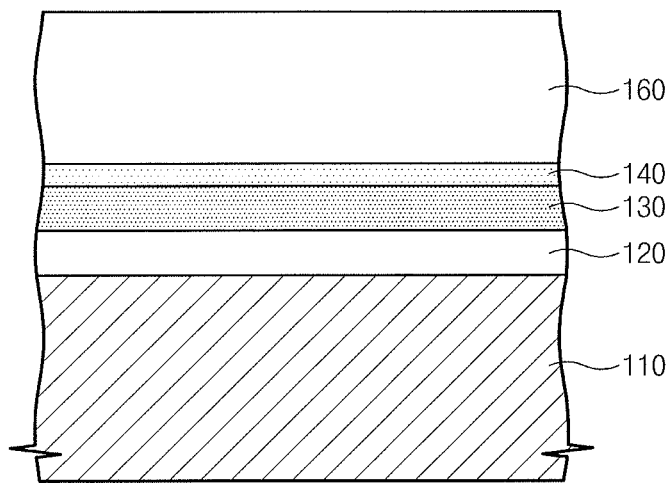

FIGS. 1A to 1C illustrate cross-sectional views of stages in a method of fabricating a semiconductor device according to an embodiment. Referring to FIG. 1A, a gate layer 110 may be formed. The gate layer 110 may include a conductive material, e.g., polysilicon and/or metal. A blocking insulating layer 120 may be formed on the gate layer 110. A charge storage layer 130 may be formed on the blocking insulating layer 120. The charge storage layer 130 may include a material capable of trapping charges, e.g., silicon nitride and/or polysilicon.

Referring to FIG. 1B, a tunnel insulating layer 140 may be formed on the charge storage layer 130 by, e.g., a heat treatment. The tunnel insulating layer 140 may include, e.g., a silicon oxide layer and/or a silicon-nitride-oxide layer. The heat treatment may include, e.g., an oxidation process and/or a nitriding process. The oxidation process may include at least one of a radical oxidation and wet oxidation. The nitriding process may include at least one of a plasma nitration and thermal nitration.

Alternatively, a semiconductor layer (not illustrated) may be deposited on the charge storage layer 130. The deposited semiconductor layer may then be converted into the tunnel insulating layer 140 by the heat treatment. The semiconductor layer may include, e.g., amorphous silicon and/or crystalline silicon. The tunnel insulating layer 140 may include, e.g., a silicon oxide layer. The heat treatment may include, e.g., an oxidation process.

In contrast to a method of forming the tunnel insulating layer on a silicon substrate by the oxidation process or the nitriding process in a gate stack structure of a two-dimensional memory semiconductor device, the present embodiment may provide a method of forming the tunnel insulating layer 140 applicable to a reverse gate stack structure. The reverse gate stack structure may be formed by sequentially stacking the gate layer 110, the blocking insulating layer 120, the charge storage layer 130, and the tunnel insulating layer 140.

Referring to FIG. 1C, an active layer 160 may be formed on the tunnel insulating layer 140. The active layer 160 may include, e.g., crystalline silicon.

Figure 2A:
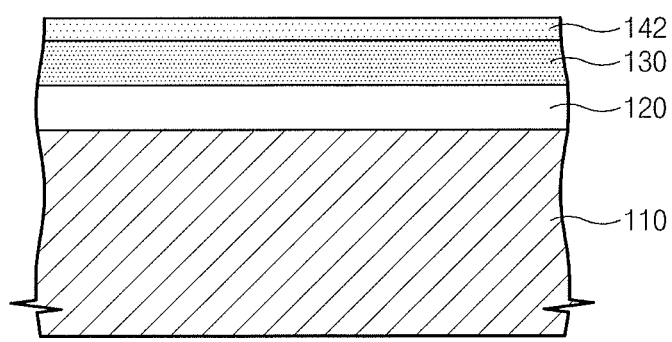
FIGS. 2A to 2C illustrate cross-sectional views of stages in a method of fabricating a semiconductor device according to a another embodiment.
Figure 2B:
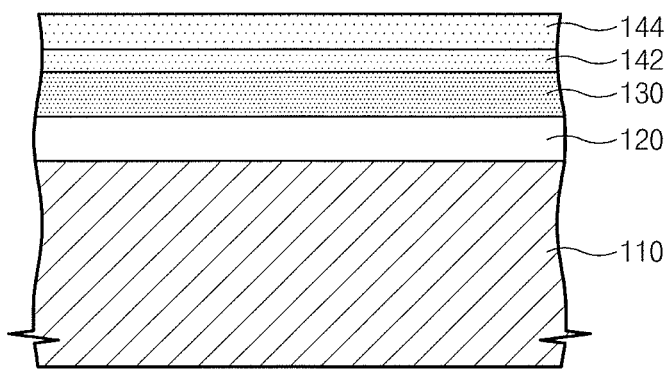
Figure 2C:
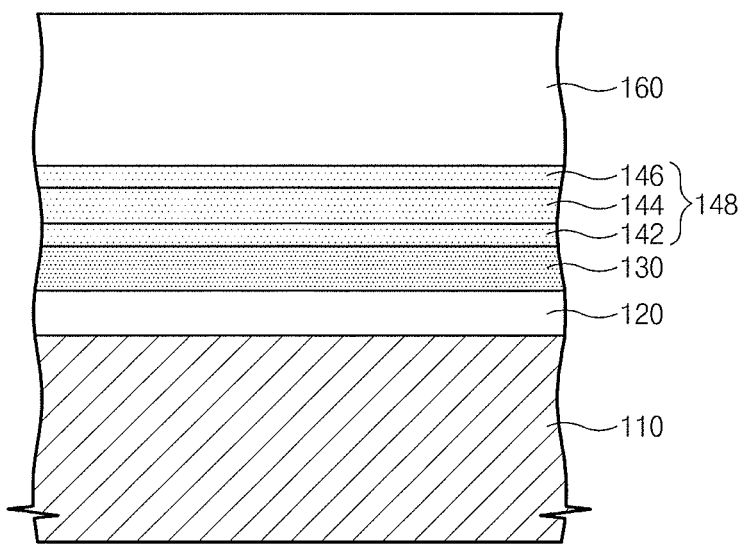

FIGS. 2A to 2C illustrate cross-sectional views of stages in a method of fabricating a semiconductor device according to another embodiment. Because the present embodiment is similar to the above-described embodiment, repeated description of duplicated technical features are omitted.

Referring to FIG. 2A, the gate layer 110, the blocking insulating layer 120, the charge storage layer 130, and a first tunnel insulating layer 142 may be stacked sequentially in the same manner as described with respect to FIG. 1A and FIG. 1B.

Referring to FIG. 2B, a second tunnel insulating layer 144 may be formed on the first tunnel insulating layer 142. In an implementation, the second tunnel insulating layer 144 may be formed by an oxidation or nitriding process of the first tunnel insulating layer 142. The second tunnel insulating layer 144 may include, e.g., a silicon oxide layer and/or a silicon-nitride-oxide layer.

In another implementation, a first semiconductor layer (not illustrated) may be deposited on the first tunnel insulating layer 142. The first semiconductor layer deposited on the first tunnel insulating layer 142 may be converted into the second tunnel insulating layer 144 by an oxidation process. The first semiconductor layer may include, e.g., amorphous silicon and/or crystalline silicon.

In yet another implementation, the second tunnel insulating layer 144 may be formed on the first tunnel insulating layer 142 by depositing thereon, e.g., a silicon oxide layer, a silicon nitride layer, and/or a high-k layer.

Referring to FIG. 2C, a third tunnel insulating layer 146 may be formed on the second tunnel insulating layer 144. In an implementation, the third tunnel insulating layer 146 may be formed by an oxidation or nitriding process of the second tunnel insulating layer 144. The third tunnel insulating layer 146 may include, e.g., a silicon oxide layer and/or a silicon-nitride-oxide layer.

In another implementation, a second semiconductor layer may be deposited on the second tunnel insulating layer 144. The second semiconductor layer deposited on the second tunnel insulating layer 144 may be converted into the third tunnel insulating layer 146 by an oxidation process. The second semiconductor layer may include, e.g., amorphous silicon and/or crystalline silicon.

In still another implementation, the third tunnel insulating layer 146 may be formed on the second tunnel insulating layer 144 by depositing thereon, e.g., a silicon oxide layer and/or a silicon nitride layer.

The first to third tunnel insulating layers 142, 144, and 146 together may be used as a charge tunneling layer 148. In an implementation, one layer, or a combination of two layers, of the first to third tunnel insulating layers 142, 144, and 146 may be used as the charge tunneling layer 148. According to the present embodiment, the first to third tunnel insulating layers 142, 144, and 146 may have different oxygen concentration gradients and/or nitrogen concentration gradients from one another. Moreover, the second tunnel insulating layer 144 may have a higher dielectric constant than the first tunnel insulating layer 142 and the third tunnel insulating layer 146.

Figure 3:
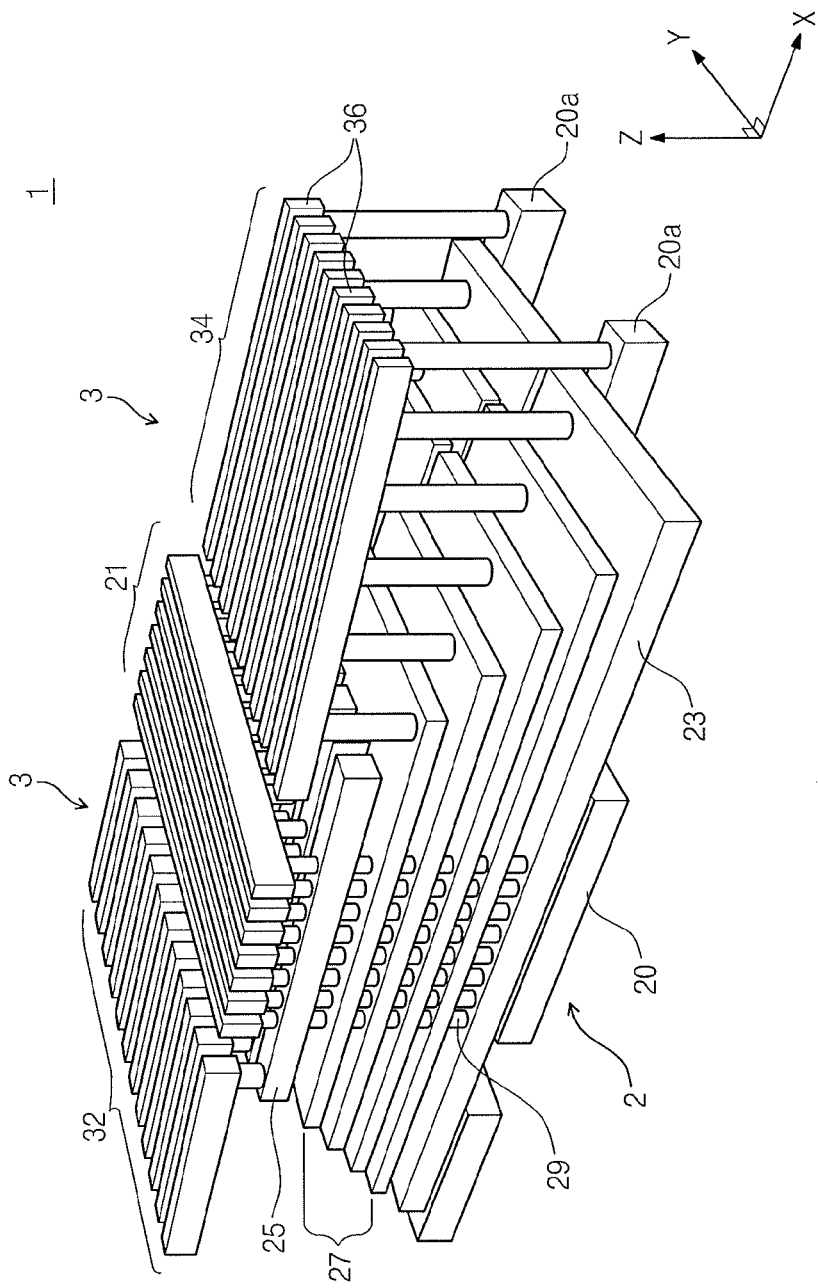
FIG. 3 illustrates a perspective view of a semiconductor device according to an embodiment.

FIG. 3 illustrates a perspective view of a semiconductor device according to an embodiment. Referring to FIG. 3, a semiconductor device 1 may include a cell region 2 having memory cells and a peripheral region 3 having a peripheral circuit for operating the memory cells. The configuration of the semiconductor device 1 according to an embodiment will be described below. An example is disclosed in U.S. Patent Application Publication No. 2007-0252201, which is incorporated by reference herein in its entirety.

The cell region 2 may be vertically stacked on a semiconductor substrate 20 in a Z-direction. The cell region 2 may include a plurality of plate-shaped control gates 27 forming an X-Y plane, an upper selective gate 25, a lower selective gate 23, a plurality of bit lines 21, and a plurality of active portions 29. The upper selective gate 25 and the lower selective gate 23 may be stacked on upper and lower parts of the plurality of control gates 27, respectively. The plurality of bit lines 21 may be stacked on the upper selective gate 25 and may extend in a Y-direction. The plurality of active portions 29 may extend vertically in the Z-direction on the semiconductor substrate 20. Each of the active portions 29 may extend from the semiconductor substrate 20 to the bit lines 21, penetrating the upper and lower selective gate 23 and 25 and the control gate 27. The semiconductor substrate 20 may be, e.g., a P-type silicon substrate. In this case, the active portions 29 may be formed on a N+ region of the P-type silicon substrate. Alternatively, the N+ region may not be formed between the semiconductor substrate 20 and the active portion 29.

One of the lower selective gate 23 and the upper selective gate 25 may have a plate shape forming the X-Y plane, and the other may have a line shape extending in an X-direction. Alternatively, both the lower selective gate 23 and the upper selective gate 25 may have a line shape extending in the X-direction. In an implementation, the lower selective gate 23 may have the plate shape forming the X-Y plane, and the upper selective gate 25 may have the line shape extending in the X-direction.

The peripheral region 3 may include an upper selective line driving circuit 32 connected to the plurality of upper selective gates 25, a word line driving circuit 34 connected to the plurality of control gates 27, and a common source line 36 connected to a source 20a of the semiconductor substrate 20. The source 20a may be of a different conductive type from the semiconductor substrate 20. For example, when the conductive type of the semiconductor substrate 20 is P-type, the conductive type of the source 20a may be N-type.

Figure 4:
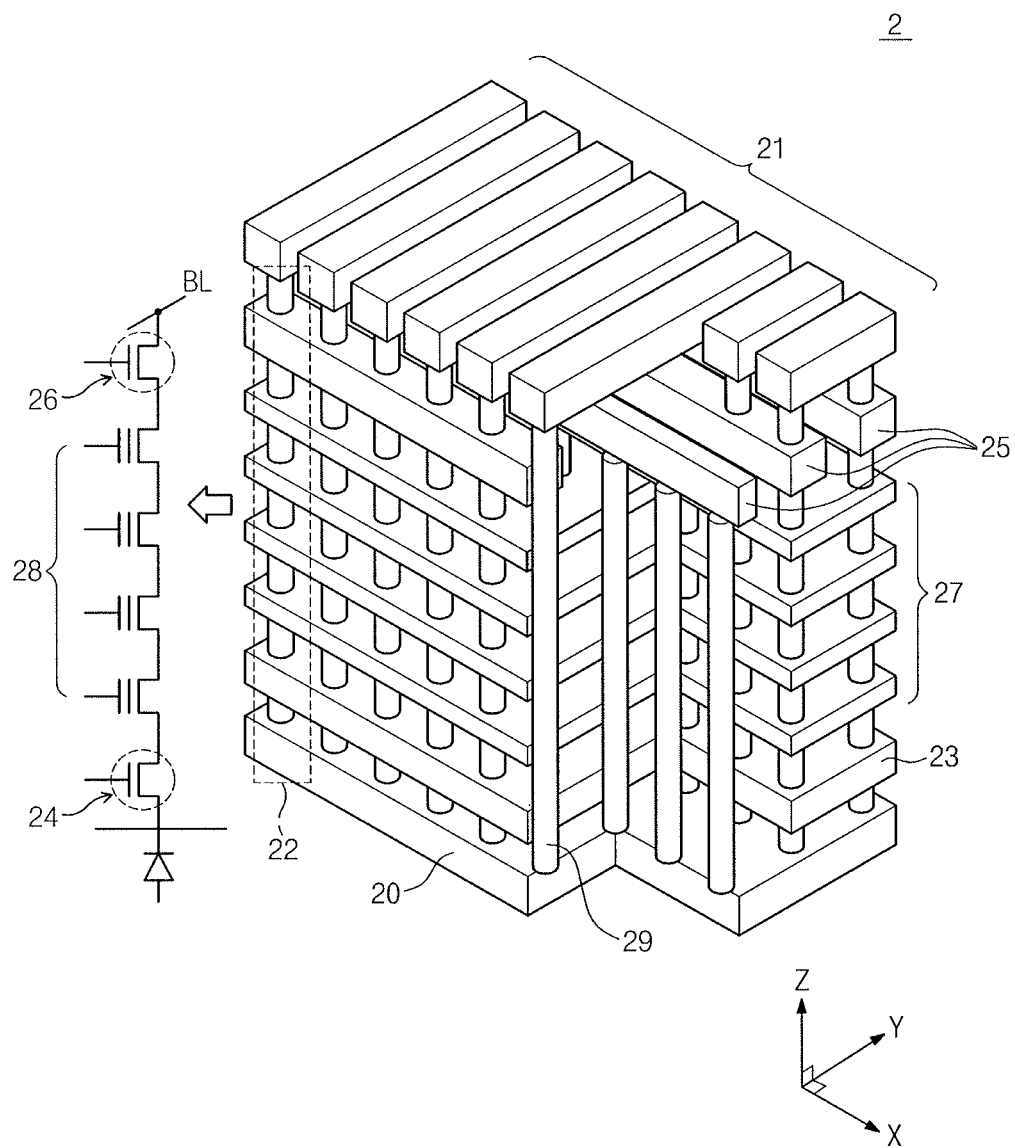
FIG. 4 illustrates a perspective view of a cell region of FIG. 3.
Figure 5:
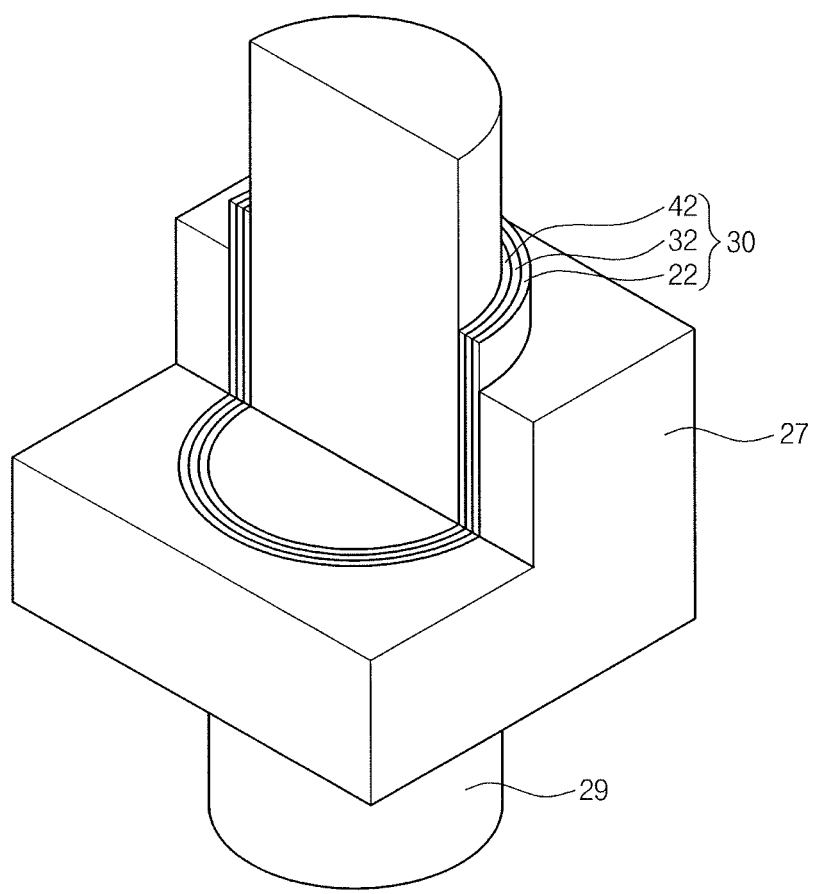
FIG. 5 illustrates a perspective view of a memory transistor of FIG. 4.

FIG. 4 illustrates a perspective view of the cell region of FIG. 3. FIG. 5 illustrates a perspective view of a memory transistor of FIG. 4. Referring to FIGS. 4 and 5, a plurality of memory transistors 28 may be defined by the active portions 29 and the control gates 27. A lower selective transistor 24 may be defined by the active portions 29 and the lower selective gate 23. An upper selective transistor 26 may be defined by the active portions 29 and the upper selective gate 25. The semiconductor device may be, e.g., a NAND flash memory device, that forms one cell string 22 by connecting the plurality of memory transistors 28 to the upper and lower selective transistors 26 and 24 in series. In an implementation, one cell string 22 may include four memory transistors 28. However, the number of memory transistors 28 in one cell string 22 may be arbitrarily changed depending on desired memory capacities. The active portions 29 may have an arbitrary pillar shape, e.g., a cylindrical shape having a circular cross-section or a rectangle shape having a rectangular cross-section.

In an implementation, the memory transistors 28 and the upper and lower selective transistors 26 and 24 may be depletion mode transistors in which a source and drain do not exist in the active portions 29. In another implementation, the memory transistors 28 and the upper and lower selective transistors 26 and 24 may be enhancement mode transistors in which a source and drain do exist in the active portions 29.

The plurality of active portions 29 may have a Z-directional axis penetrating the plurality of control gates 27. Thus, intersection points of the plurality of control gates 27 with the plurality of active portions 29 may be distributed three-dimensionally. In other words, the memory transistors 28 of the semiconductor device may be respectively formed at the three-dimensionally distributed intersection points. A gate insulating layer 30 may be disposed between the plurality of active portions 29 and the plurality of control gates 27. The gate insulating layer 30 may include a blocking insulating layer 22, a charge storage layer 32, and a tunnel insulating layer 42. The blocking insulating layer 22, charge storage layer 32, and tunnel insulating layer 42 may be formed by the same method as described above with reference to FIGS. 1 and 2.

Figure 6:
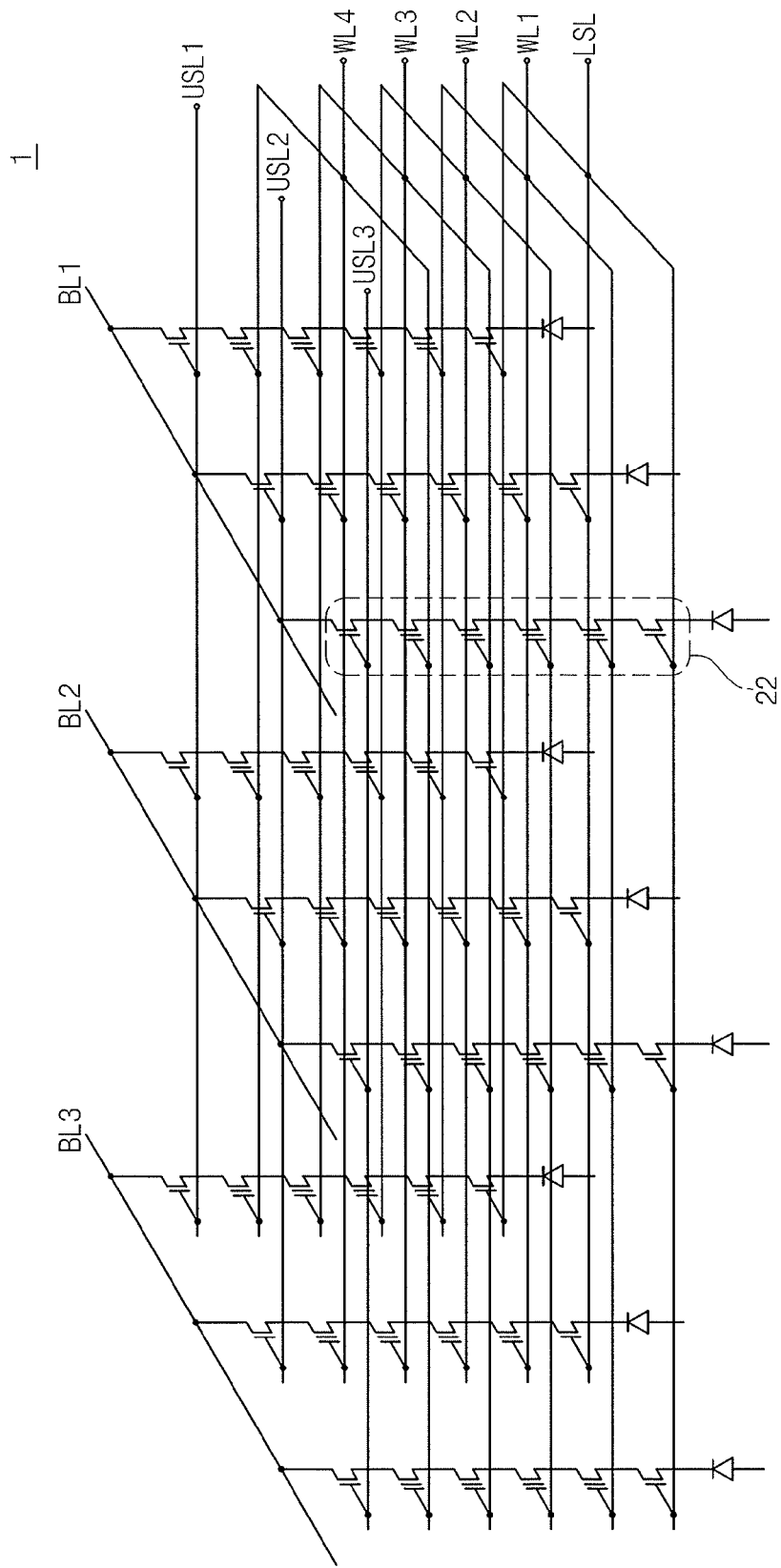
FIG. 6 illustrates an equivalent circuit view of a part of a semiconductor device according to an embodiment.

FIG. 6 illustrates an equivalent circuit view of a part of the semiconductor device according to an embodiment. Referring to FIGS. 1 to 6, in the semiconductor device 1, the plurality of control gates 27 may be used as a plurality of word lines WL1 to WL4, the plurality of upper selective gates 25 may be used as a plurality of upper selective lines USL1 to USL3, and the lower selective gate 23 may be used as a lower selective line LSL. The cell string 22 may be connected to each of the bit lines BL1 to BL3.

Since each of the control gates 27 may form a flat-plate structure that spreads out two-dimensionally, each of the word lines WL1 to WL4 may have a plane structure and may be substantially perpendicular to the cell string 22. The plurality of memory transistors 28 may be distributed three-dimensionally in the plurality of word lines WL1 to WL4.

Since the upper selective gate 25 may form a separated wiring structure extending in the X-direction, the plurality of upper selective lines USL1 to USL3 may intersect the plurality of bit lines BL1 to BL3. Each of the upper selective lines USL1 to USL3 may be electrically connected to each of the bit lines BL1 to BL3. Accordingly, each cell string 22 may be independently selected.

Since the lower selective gate 23 may form a flat-plate structure that spreads out two-dimensionally, the lower selective line LSL may have a plane structure and may be substantially perpendicular to the cell string 22. The lower selective line LSL may control an electrical connection between the active portion 29 and the semiconductor substrate 20.

In the semiconductor device 1, a program operation may include setting a voltage difference between a selected word line WL and active portion 29 and injecting charges into the charge storage layer of the memory transistor 28. In an implementation, the program may include applying program voltage Vprog to the selected word line WL and injecting electrons from the active portion 29 into the charge storage layer 32 of the memory transistor 28 corresponding to the desired word line WL intended to program, using Fowler-Nordenheim (FN) tunneling. Since the memory transistor 28, which corresponds to a non-selected word line, may be programmed by the program voltage applied to the selected word line WL, a boosting technology may be used to prevent an inadvertent program.

A reading operation may be performed by setting the word line WL connected to the desired memory transistor 28 to 0V and by setting another word line to read voltage Vread. Thus, it may be determined whether current is charged in the bit line BL depending on whether or not a threshold voltage Vth of the memory transistor 28 intended to be read is greater than an existing voltage. Accordingly, data information of the desired memory transistor 28 may be read by sensing the current of the corresponding bit line BL.

An erasing operation may be performed for each block using, e.g., a Gate-Induced Drain Leakage (GIDL) current. An erase voltage Verase may be applied to the selected bit line BL and the semiconductor substrate 200, thereby raising the potential of the active portion 29. In an implementation, the potential of the active portion 29 may rise slowly. The GIDL may be generated at a terminal of the lower selective gate 24, electrons generated by the GIDL may be emitted into the semiconductor substrate 20, and the generated holes may be emitted into the active portion 29. Thus, the potential in the vicinity of the erase voltage Verase may be transmitted to the channel of the memory transistor 28, i.e., the active portion 29. If the potential of the word line WL is set to 0V, the electrons stored in the memory transistor 28 may be emitted, thereby erasing the data. Meanwhile, an inadvertent erasing operation may be prevented by floating the word line of the non-selected block.

The method of operating the semiconductor device 1 described above is not limited thereto. Accordingly, it will be apparent to those skilled in the art that various modifications and changes may easily be embodied on the basis of the known technical. For example, the operation of the semiconductor device 1 may be embodied in the same way as disclosed in U.S. Patent Application Publication No. 2007-0252201, which has been incorporated by reference herein.

Figure 7A:
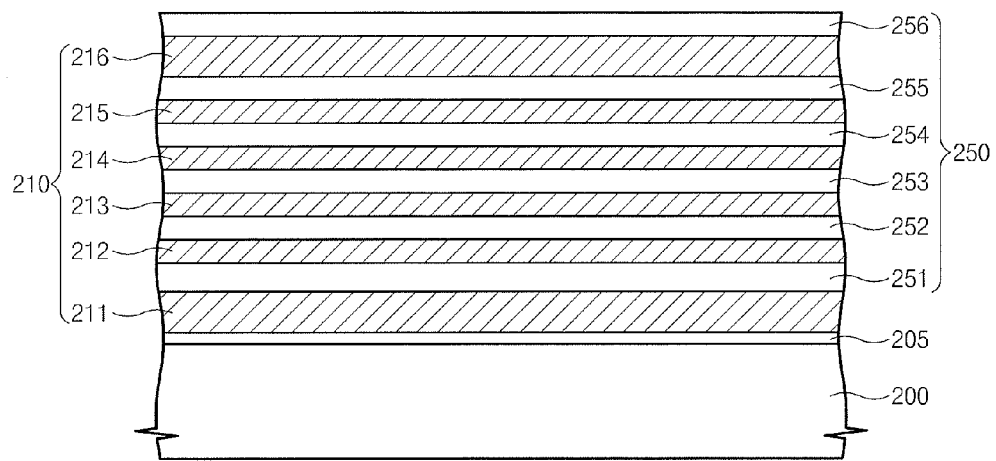
FIGS. 7A to 7D illustrate cross-sectional views of stages in a method of fabricating a semiconductor device according to yet another embodiment.

FIGS. 7A to 7D illustrate cross-sectional views of stages in a method of fabricating a semiconductor device according to another embodiment. Referring to FIG. 7A, a semiconductor substrate 200 may be provided. The semiconductor substrate 200 may be formed of a single-crystalline semiconductor, e.g., a p-type silicon wafer. The semiconductor substrate 200 may include regions, e.g., well regions, which are electrically isolated from one another by other conductive-type impurity regions. The well regions may have, e.g., a pocket well structure or a triple well structure. An etch stop layer 205 may be formed on the semiconductor substrate 200. The etch stop layer 205 may include, e.g., a silicon oxide layer. The etch stop layer 205 may be used as, e.g., a capacitor dielectric layer.

A conductive layer group 210 and an insulating layer group 250 may be formed on the etch stop layer 205. The conductive layer group 210 may include a plurality of conductive layers 211, 212, 213, 214, 215, and 216. The insulating layer group 250 may include a plurality of insulating layers 251, 252, 253, 254, 255, and 256. The conductive layers 211 to 216 and the insulating layers 251 to 256 may be alternately formed. The conductive layers 211 to 216 may be formed by, e.g., depositing a doped polycrystalline silicon and/or metal. The lowermost conductive layer 211 may serve as a lower selective gate. The uppermost conductive layer 216 may serve as an upper selective gate. The conductive layers 212, 213, 214, and 215 between the lowermost conductive layer 211 and the uppermost conductive layer 216 may serve as control gates. The conductive layers 212 to 215 may have the same thickness. The thickness of the conductive layers 212 to 215 may be selected to, e.g., avoid an undesirable short channel effect.

The insulating layers 251 to 256 may be formed by depositing on an adjoining layer or substrate, e.g., a silicon oxide layer. Alternatively, the insulating layers 251 to 256 may be formed of, e.g., a high-k dielectric layer. In an implementation, the insulating layers 251 to 256 may be formed by depositing materials on an adjoining layer or substrate, e.g., silicon nitride and/or silicon oxynitride, having a higher dielectric constant than a silicon oxide layer.

With respect to layers forming the insulating layer group 250 and the conductive layer group 210, the number of layers, the thickness of the layers, and the materials of the layers may be varied in view of desired electrical characteristics and technical difficulty in a process for patterning the layers. The insulating layer group 250 and the conductive layer group 210 may have a stair-type structure.

Figure 7B:
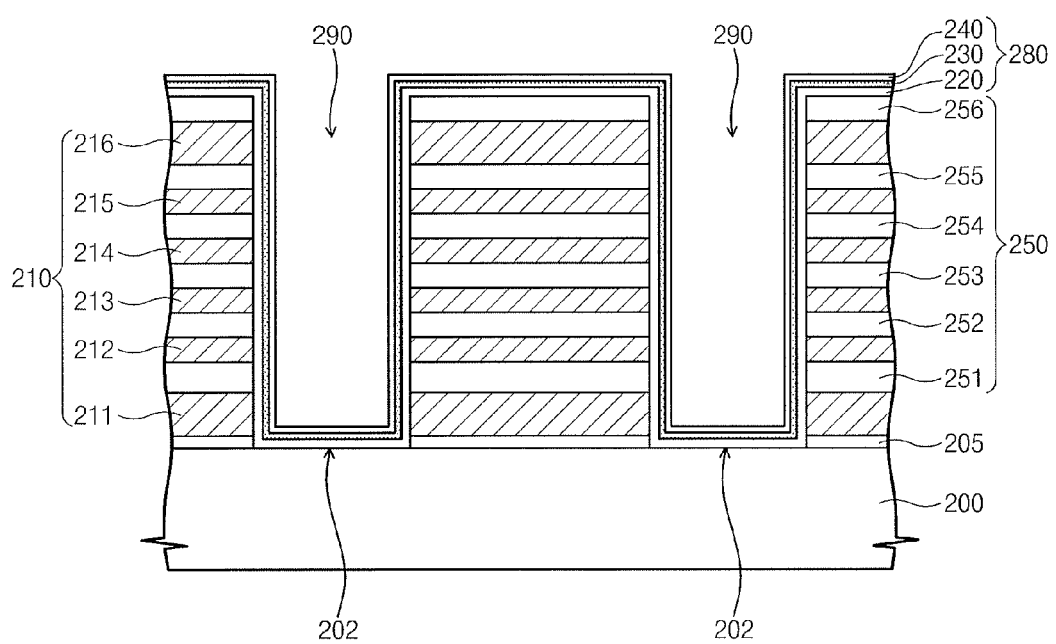

Referring to FIG. 7B, openings 290 may be formed by patterning the conductive layer group 210 and the insulating layer group 250 to expose a portion of the semiconductor substrate 200. The openings 290 may be formed using, e.g., a dry etching process, to have vertical sidewalls, thereby realizing uniform electrical characteristics of a resultant transistor. The patterning process may be performed until the etch stop layer 205 is removed. The openings 290 may expose an upper surface 202 of the semiconductor substrate 200. The sidewalls of the openings 290 may include exposed sidewalls of the conductive layers 211 to 216 in the conductive layer group 210.

A gate insulating layer 280 may be formed at the sidewalls of the openings 290 to cover the exposed sidewalls of the conductive layers 211 to 216. The gate insulating layer 280 may include a blocking insulating layer 220, a charge storage layer 230, and a tunnel insulating layer 240. The blocking insulating layer 220, the charge storage layer 230, and the tunnel insulating layer 240 may be laterally stacked in the same way or in a similar way as described above with reference to FIGS. 1 and 2. That is, the method of forming the tunnel insulating layer 240 according to the previous embodiment may be applied to a gate structure of a three-dimensional semiconductor memory device.

Figure 7C:
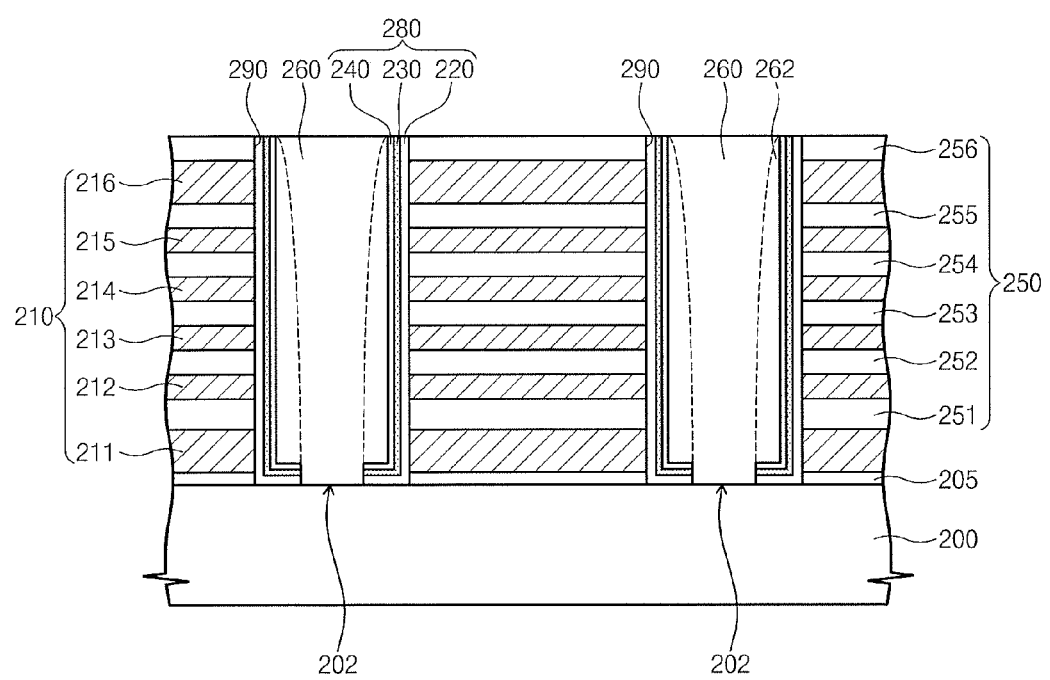

Referring to FIG. 7C, spacers 262 may be formed at the sidewalls of the openings 290. A portion of the gate insulating layer 280 may be etched using the spacers 262 as an etch mask, thereby exposing an upper surface 202 of the semiconductor substrate 200. The spacers 262 may be formed on the gate insulating layer 280 in the openings 290 to cover inner sidewalls thereof. The spacers 262 may, e.g., reduce damage to the gate insulating layer 280 during the etching process for exposing the upper surface 202 of the semiconductor substrate 200.

Active portions 260 may fill the openings 290. The active portions 260 and the semiconductor substrate 200 may include a same material. The active portions 260 may grow from the exposed upper surface 202 of the semiconductor substrate 200 by, e.g., an epitaxial process. In an implementation, the semiconductor substrate 200 and the active portions 260 may be single-crystalline silicon without a crystal defect. When the spacers 262 are formed of silicon, the spacers 262 may be single-crystallized during the epitaxial process to form a portion of the active portions 260. The active portions 260 may have the same conductive type as the semiconductor substrate 200. For example, both the semiconductor substrate 200 and the active portions 260 may be P-type. Thus, since a diode is not configured between the active portions 260 and the semiconductor substrate 200, the active portions 260 may have the same equipotential as the semiconductor substrate 200.

Figure 7D:
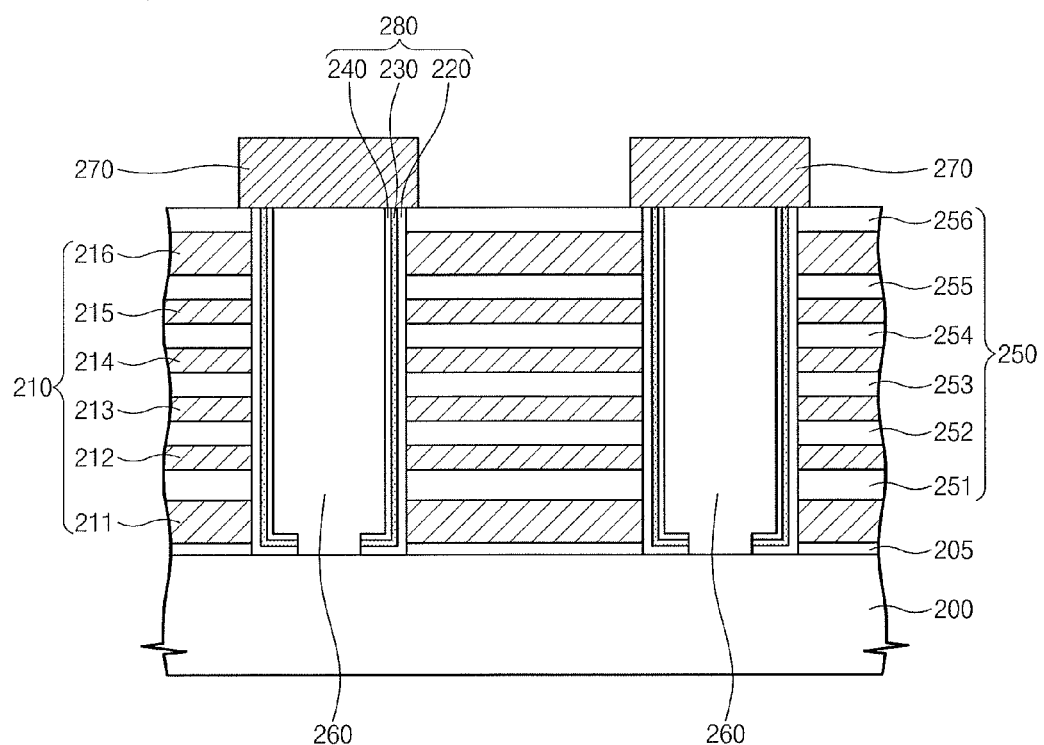

Referring to FIG. 7D, bit lines 270 may be formed on the active portions 260. The bit lines 270 may be electrically connected to the active portions 260. Furthermore, the bit line 270 may extend in a direction intersecting the upper selective gate.

Figure 8:
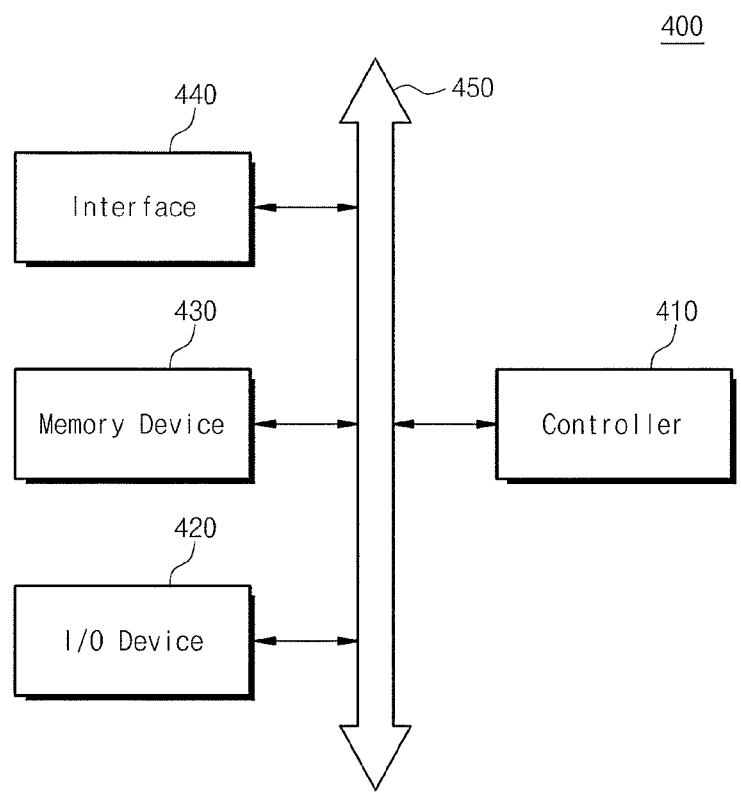
FIG. 8 illustrates a block diagram of an electronic system including a semiconductor device according to an embodiment.

FIG. 8 illustrates a block diagram of an electronic system including the semiconductor device according to an embodiment. Referring to FIG. 8, an electronic system 400 may include a controller 410, an input and output (I/O) device 420, and a memory device 430. The controller 410, the I/O device 420, and the memory device 430 may be coupled to each other via a bus 450. The bus 450 may be a transfer pathway of data and/or operation signals. The controller 410 may include at least one of a microprocessor, a digital signal process, and a microcontroller, and at least one logic device that can execute functions similar to these. The I/O device 420 may include at least one of a keypad, a keyboard, and a display device. The memory device 430 may store data and/or instructions to be executed by the controller 410. The memory device 430 may include a semiconductor memory device according to an embodiment. The electronic system 400 may further include an interface 440 for, e.g., transmitting data to a communication network or receiving data from a communication network. The interface 440 may be, e.g., wired or wireless. The interface 440 may include, e.g., an antenna or a wired/wireless transceiver.

The electronic system 400 may include, e.g., a mobile system, personal computer, industrial computer, and/or system carrying out various functions. The mobile system may include, e.g., a personal digital assistant (PDA), portable computer, web tablet, mobile phone, wireless phone, laptop computer, memory card, digital music system, and/or information transmitting/receiving system. The electronic system 400 may be used in a communication interface protocol of 3G communication system, e.g., CDMA, GSM, NADC, E-TDMA, WCDAM, and/or CDMA2000, when the electronic system 400 constitutes equipment capable of carrying out wireless communications.

Figure 9:
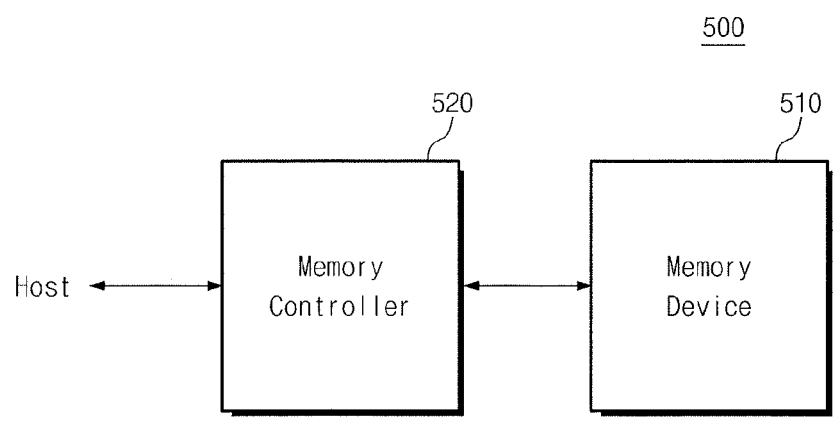
FIG. 9 illustrates a block diagram of a memory card including a semiconductor device according to an embodiment.

FIG. 9 illustrates a block diagram of a memory card including a semiconductor device according to an embodiment. Referring to FIG. 9, a memory card 500 may include a memory device 510 and a memory controller 520. The memory device 510 may store data. Preferably, the memory device 510 has non-volatile characteristics for retaining the stored data in its entirety even if a power source is interrupted. The memory device 510 may include the semiconductor memory device according to an embodiment. The memory controller 520 may read out data stored in the memory device 510 and/or may store data in the memory device 510 in response to a read/write request from a host.

Furthermore, the memory device 510, e.g., a flash memory device or flash memory system, may be mounted by various types of packages. The flash memory device or the flash memory system may be packaged and mounted as, e.g., Package on Package (PoP), Ball Grid Arrays (BGAs), Chip Scale Packages (CSPs), Plastic Leaded Chip Carrier (PLCC), Plastic Dual In-Line Package (PDIP), Multi Chip Package (MCP), Wafer Level Package, Wafer-level Fabricated Package (WFP), Wafer-Level Processed Stack Package (WSP), Die in Waffle Pack, Die in Wafer Form, Chip On Board (COB), Ceramic Dual In-Line Package (CERDIP), Plastic Metric Quad Flat Pack (MQFP), Thin Quad Flat pack (TQFP), Small Outline Package (SOIC), Shrink Small Outline Package (SSOP), Thin Small Outline Package (TSOP), Thin Quad Flat Package (TQFP), System In Package (SIP), and the like.

According to an embodiment, the method of forming the tunnel insulating layer may be applicable to the reverse gate stack structure. In addition, the method of forming the tunnel insulating layer may be applicable to the three-dimensional semiconductor memory structure.

Exemplary embodiments have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A semiconductor device, comprising:
 conductive layers and insulating layers repeatedly and alternatingly stacked on a substrate;
 an active portion penetrating the conductive layers and the insulating layers to connect the substrate; and
 a blocking insulating layer, a charge storage layer, and a charge tunneling layer sequentially disposed from the conductive layers to the active portion;
 wherein the conductive layers are electron injecting layers that inject electrons from the active portion to the charge storage layer through the charge tunneling layer;
 wherein the charge tunneling layer includes a first tunnel insulating layer, a second tunnel insulating layer, and a third tunnel insulating layer sequentially disposed from the charge storage layer to the active portion, wherein the first, second, and third tunnel insulating layers are charge tunneling layers;
 wherein the second tunnel insulating layer includes a silicon-nitride-oxide layer; and
 wherein the second tunnel insulating layer has a higher dielectric constant than the first tunnel insulating layer and the third tunnel insulating layer.

2. The semiconductor device as claimed in claim 1, wherein the first tunnel insulating layer includes at least one of an oxide or a nitride-oxide.

3. The semiconductor device as claimed in claim 1, wherein the first tunnel insulating layer has a different oxygen concentration or different nitrogen concentration from the second tunnel insulating layer.

4. The semiconductor device as claimed in claim 1, wherein the charge storage layer comprises a silicon nitride layer.

5. The semiconductor device as claimed in claim 1, wherein the first tunnel insulating layer, the second tunnel insulating layer, and the third tunnel insulating layer have different oxygen concentration gradients or nitrogen concentration gradients from one another.

6. The semiconductor device as claimed in claim 1, wherein the active portion is in direct contact with the substrate.

7. The semiconductor device as claimed in claim 1, further comprising an opening penetrating the conductive layers and the insulating layers, such that at least a portion of the substrate is exposed,
 wherein at least one of the blocking insulating layer, the charge storage layer, and the charge tunneling layer is disposed in the opening.

8. The semiconductor device as claimed in claim 1, wherein the conductive layers comprise a lower selective gate, control gates, and an upper selective gate sequentially disposed on the substrate.

9. The semiconductor device as claimed in claim 1, wherein the first tunnel insulating layer and the third tunnel insulating layer are each a silicon oxide layer.

10. A semiconductor device, comprising:
 an active portion;
 a gate insulating layer surrounding a side surface of the active portion; and
 a control gate surrounding a side surface of the gate insulating layer,
 wherein the gate insulating layer includes a blocking insulating layer, a charge storage layer, and a charge tunneling layer sequentially disposed from the control gate to the active portion,
 wherein the charge tunneling layer includes a first tunnel insulating layer, a second tunnel insulating layer, and a third tunnel insulating layer sequentially disposed from the charge storage layer to the active portion, wherein the first, second, and third tunnel insulating layers are charge tunneling layers;

wherein the first tunnel insulating layer, the second tunnel insulating layer, and the third tunnel insulating layer have different oxygen concentration gradients or nitrogen concentration gradients from one another; and wherein the second tunnel insulating layer has a higher dielectric constant than the first tunnel insulating layer and the third tunnel insulating layer.

11. The semiconductor device as claimed in claim 10, wherein the control gate is an electron injecting layer that injects electrons from the active portion to the charge storage layer through the charge tunneling layer by Fowler-Nordenheim tunneling.

12. The semiconductor device as claimed in claim 10, wherein the first tunnel insulating layer, the second tunnel insulating layer, and the third tunnel insulating layer comprise a silicon oxide layer, a silicon-nitride-oxide layer, and a silicon oxide layer respectively.

13. The semiconductor device as claimed in claim 10, wherein each of the first tunnel insulating layer and the second tunnel insulating layer includes at least one of an oxide or a nitride-oxide.

14. The semiconductor device as claimed in claim 10, wherein the first tunnel insulating layer has a different oxygen concentration or different nitrogen concentration from the second tunnel insulating layer.

15. The semiconductor device as claimed in claim 1, wherein the charge storage layer includes polysilicon.

16. The semiconductor device as claimed in claim 10, wherein the charge storage layer includes polysilicon.

17. The semiconductor device as claimed in claim 1, wherein a first surface of the first tunnel insulating layer is in direct contact with the charge storage layer, and a second surface opposite to the first surface of the first tunnel insulating layer is in direct contact with the second tunnel insulating layer.

18. A semiconductor device, comprising:
conductive layers and insulating layers repeatedly and alternatingly stacked on a substrate;
an active portion penetrating the conductive layers and the insulating layers to connect the substrate; and
a blocking insulating layer, a charge storage layer, and a charge tunneling layer sequentially disposed from the conductive layers to the active portion;
wherein the charge storage layer includes a silicon nitride layer;
wherein the charge tunneling layer includes a first tunnel insulating layer, a second tunnel insulating layer, and a third tunnel insulating layer sequentially disposed from the charge storage layer to the active portion, wherein the first, second, and third tunnel insulating layers are charge tunneling layers; and
wherein the third tunnel insulating layer is in direct contact with the active portion;
wherein a nitrogen concentration of the second tunnel insulating layer is greater than respective nitrogen concentrations of the first and third tunnel insulating layers
wherein the second tunnel insulating layer has a higher dielectric constant than the first tunnel insulating layer and the third tunnel insulating layer.

19. The semiconductor device as claimed in claim 18, wherein the conductive layers are electron injecting layers that inject electrons from the active portion to the charge storage layer through the charge tunneling layer.

20. The semiconductor device as claimed in claim 18, wherein the first tunnel insulating layer is in direct contact with the charge storage layer.

* * * * *